(12) United States Patent
Osenbach et al.

(10) Patent No.: US 12,300,621 B2
(45) Date of Patent: May 13, 2025

(54) HYBRID INTEGRATED CIRCUIT PACKAGE

(71) Applicant: Infinera Corp., Sunnyvale, CA (US)

(72) Inventors: John W. Osenbach, Kutztown, PA (US); Jiaming Zhang, Macungie, PA (US)

(73) Assignee: Infinera Corporation, San Jose, CA (US)

( * ) Notice: Subject to any disclaimer, the term of this patent is extended or adjusted under 35 U.S.C. 154(b) by 467 days.

(21) Appl. No.: 17/583,895

(22) Filed: Jan. 25, 2022

(65) Prior Publication Data
US 2022/0238449 A1 Jul. 28, 2022

Related U.S. Application Data

(60) Provisional application No. 63/141,109, filed on Jan. 25, 2021.

(51) Int. Cl.
*H01L 23/538* (2006.01)
*H01L 23/64* (2006.01)
*H01L 49/02* (2006.01)

(52) U.S. Cl.
CPC ........ *H01L 23/5384* (2013.01); *H01L 23/642* (2013.01); *H01L 28/40* (2013.01)

(58) Field of Classification Search
CPC . H01L 23/5384; H01L 23/642; H01L 23/562; H01L 23/50; H01L 23/5383; H01L 23/4006; H01L 28/40
See application file for complete search history.

(56) References Cited

U.S. PATENT DOCUMENTS

| | | | | |
|---|---|---|---|---|
| 2010/0027225 A1* | 2/2010 | Yuda | ..................... | H05K 3/4697 156/247 |
| 2016/0099197 A1* | 4/2016 | Uematsu | ............. | H01L 23/5385 257/759 |
| 2017/0033038 A1* | 2/2017 | Nakagawa | .............. | H01L 25/00 |
| 2018/0254252 A1* | 9/2018 | Nakagawa | .............. | H01L 23/50 |

* cited by examiner

*Primary Examiner* — Kyoung Lee
*Assistant Examiner* — Christina A Sylvia

(57) ABSTRACT

Disclosed herein are multi-layer substrates for integrated circuit packages and methods of making the same. The multi-layer substrate may comprise a plurality of lower layers, at least one core layer, a plurality of upper layers, and a side surface. A first connection and a second connection may extend through or on an uppermost layer of the plurality of upper layers. A trace may be embedded in or on one of the plurality of upper layers, the trace electrically connected to the first connection and the second connection. A first mounting pad and a second mounting pad may be positioned on the side surface and/or the uppermost layer of the plurality of upper layers and a blocking capacitor may be electrically connected to the first mounting pad and the second mounting pad with the second mounting pad electrically connected to the second connection.

17 Claims, 8 Drawing Sheets

HYBRID INTEGRATED CIRCUIT PACKAGE

INCORPORATION BY REFERENCE

The entirety of the following patents and patent applications are hereby expressly incorporated herein by reference: U.S. Provisional Patent Application No. 63/141,109 filed Jan. 25, 2021.

FIELD OF THE DISCLOSURE

The disclosure generally relates to methods and apparatuses that increase a bandwidth of a connection and reduces the chances of impedance losses or bad connections between an external signal source and an integrated circuit in an integrated circuit package. More particularly the disclosure relates to integration of a connection into or on an uppermost layer of a multi-layer substrate for connecting the external signal source to the integrated circuit through microvias and signal paths that are integrated into the uppermost layer of the multi-layer substrate.

BACKGROUND

Many current integrated circuit packages include a multi-layer substrate upon which an integrated circuit and stiffener ring are mounted. The multi-layer substrate can be connected to electrical pathways on a printed circuit board with the use of a ball grid array, for example, located on a lowermost layer (i.e., bottom) of the multi-layer substrate. The multi-layer substrate is made up of multiple alternating layers of metal and dielectric material affixed to the top and bottom of one or more cores. The multi-layer substrate of the integrated circuit package may be one conventional type that has a 6-2-6 configuration meaning it consists of one core with metallization on each side (2) laminated between six upper and six lower metal and build-up dielectric layers. The cores may consist of layers of glass filled epoxy. The build-up layers are formed from some type of resin. Various metallization structures are interspersed in the core and build-up layers in order to provide electrical pathways between pins or pads on the lowermost layer of the multi-layer substrate that interface with a ball grid array (BGA), for instance, and electrical interconnects on an uppermost layer of the multi-layer substrate that interface with the integrated circuit. Vias are used to connect the metallization structures in one layer or core to the metallization structures in the next layer or core. Each connection is an interface where impedance mismatches are possible. If such mismatches occur this results in an increase in electrical insertion loss and reflection and thus a decrease in bandwidth.

One such design is the connection between Photonic Integration Module (PIC module), connected to a BGA packaged integrated circuit through electrical pathways on a printed circuit board upon which the integrated circuit package is mounted. Signals received from the electrical pathways on the printed circuit board are passed through metallization structures interspersed in the core and build-up layers starting with the BGA at the bottom and travelling through all the build-up layers and the core by way of vias. At each connection of the buildup package and printed circuit board an impedance mismatch can occur, which degrades the bandwidth and limit the performance of such a design. Although not exclusive, it has been found that the largest such impedance mismatches typically occur in and around the core connections and the BGA connections.

SUMMARY

Methods and systems are disclosed that solve the problems of low bandwidth connections, impedance losses, and poor contact between an external signal source and an integrated circuit in an integrated circuit package by providing a multi-layer substrate of the integrated circuit package with at least one connection forming an electrical pathway on an upper most layer of the integrated circuit package in an area outside of a surface mount area configured to receive the integrated circuit. The at least one connection extends on the upper most layer, or by way of at least two vias and a trace within the integrated circuit package or combinations thereof, to a location within the surface mount area and serves to provide an electrical pathway for connecting the external signal source to the integrated circuit.

More particularly, in one aspect of the present disclosure, an integrated circuit package may comprise: a multi-layer substrate having a plurality of lower layers, at least one core layer, a plurality of upper layers, and a side surface, a first connection that extends through or on an uppermost layer of the upper layers, a second connection that extends through or on the uppermost layer of the upper layers, and a trace embedded in or on one of the plurality of upper layers, the trace electrically connected to the first and second connections; an integrated circuit positioned on an uppermost layer of the plurality of upper layers of the multi-layer substrate and connected to the multi-layer substrate, the integrated circuit electrically connected to the second connection; a first mounting pad and a second mounting pad positioned on at least one of the outer peripheral edge and the uppermost layer of the plurality of upper layers of the multi-layer substrate, the second mounting pad electrically connected to the first connection; and a blocking capacitor electrically connected to the first mounting pad and the second mounting pad.

In one aspect of the present disclosure, a multi-layer substrate may comprise: a plurality of lower layers, at least one core layer, a plurality of upper layers, a side surface, a first connection that extends through or on an uppermost layer of the plurality of upper layers, a second connection that extends through or on the uppermost layer of the upper layers, and a trace embedded in or on one of the plurality of upper layers, the trace electrically connected to the first connection and the second connection; a first mounting pad and a second mounting pad positioned on at least one of the side surface and the uppermost layer of the plurality of upper layers, the second mounting pad electrically connected to the first connection; and a blocking capacitor electrically connected to the first mounting pad and the second mounting pad.

In one aspect of the present disclosure, an assembly may comprise: a multi-layer substrate comprising: a plurality of lower layers, at least one core layer, a plurality of upper layers, and a side surface, a first connection that extends through or on an uppermost layer of the upper layers, a second connection that extends through or on the uppermost layer of the upper layers, and a trace embedded in or on one of the plurality of upper layers, the trace electrically connected to the first and second connections; a first mounting pad and a second mounting pad positioned on at least one of the outer peripheral edge and the uppermost layer of the plurality of upper layers of the multi-layer substrate, the second mounting pad electrically connected to the first connection; and a blocking capacitor electrically connected to the first mounting pad and the second mounting pad; an integrated circuit positioned on the uppermost layer of the plurality of upper layers of the multi-layer substrate and connected to the multi-layer substrate, the integrated circuit electrically connected to the second connection; an external signal source electrically connected to the first mounting pad of the multi-layer substrate via a connector; and a printed circuit board, the multi-layer substrate and external signal source connected to the printed circuit board.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

Figure 1:
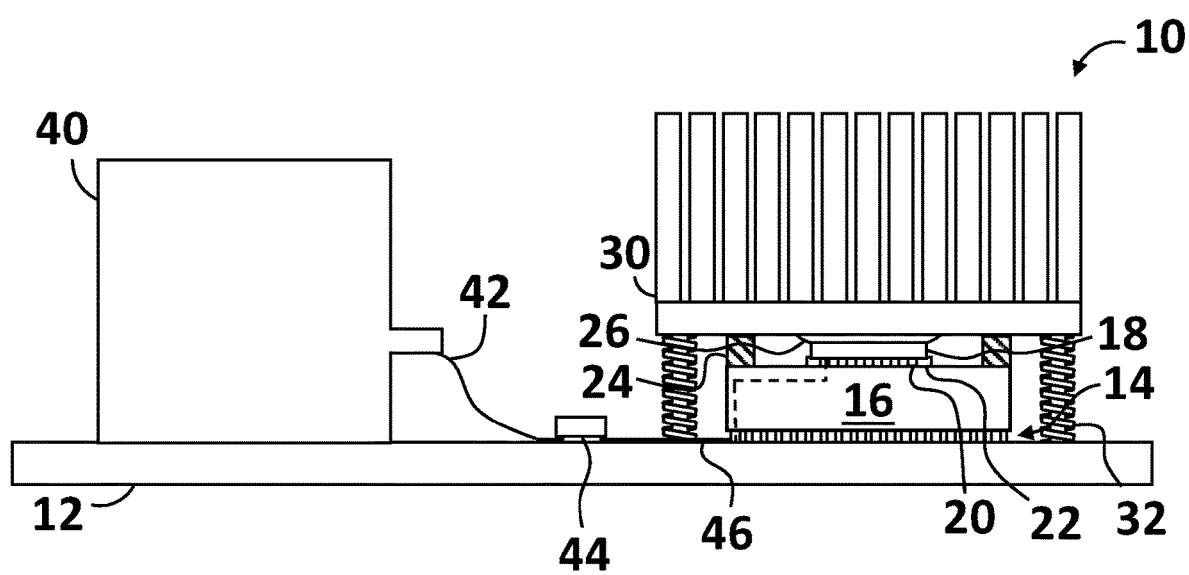
FIG. 1 is a partial sectional view of a prior art integrated circuit package.

The following detailed description refers to the accompanying drawings. The same reference numbers in different drawings may identify the same or similar elements. Before explaining at least one embodiment of the disclosure in detail, it is to be understood that the disclosure is not limited in its application to the details of construction, experiments, exemplary data, and/or the arrangement of the components set forth in the following description or illustrated in the drawings unless otherwise noted.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concept. This description should be read to include one or more and the singular also includes the plural unless it is obvious that it is meant otherwise.

Further, use of the term "plurality" is meant to convey "more than one" unless expressly stated to the contrary.

Further, the phrase "based on" is intended to mean "based, at least in part, on" unless explicitly stated otherwise.

The term "connection" means one or more parts of an electric circuit in contact so that current may flow.

Finally, as used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Referring now to the drawings, and in particular to FIG. 1, a partial sectional view of a typical prior art ball grid array (BGA) package that will be referred to herein as integrated circuit package 10 is shown. The integrated circuit package 10 illustrated in FIG. 1 is shown connected to a printed circuit board (PCB) 12 via a ball grid array (BGA) 14. The integrated circuit package 10 is provided with a multi-layer substrate 16 forming a communication pathway between the leads on the printed circuit board 12 and an integrated circuit 18. The multi-layer substrate 16 includes a surface mount area in which, solder bumps 20 (only one of which is numbered) are used to electrically connect the multi-layer substrate 16 to the integrated circuit 18. Solder bumps is a generic term that those skilled in the art will understand could refer to solder, copper pillar, copper pillar plus solder, copper-copper or other metal or combination of metals that from a metallurgical interconnection between the integrated circuit 18 and the substrate 16. The integrated circuit package 10 is further provided with an underfill 22, a stiffener ring 24, a thermal interface material 26 on a top surface of the integrated circuit 18, and a heat sink 30 positioned above the integrated circuit 18 on the thermal interface material 26.

The multi-layer substrate 16 may be made up of multiple alternating levels of metal and dielectric material affixed to the top and bottom of one or more cores. One conventional type of multi-layer substrate 16 consists of one or more cores laminated between upper and lower build-up layers. The core itself may consist of layers of glass filled epoxy. The build-up layers, which may number two or more on opposite sides of the core, are formed from some type of resin. Various metallization structures are interspersed in the core and build-up layers in order to provide electrical pathways between a first surface mount connector (e.g., conductive pins, conductive pads also known as a ball grid array) on a lowermost layer of the multi-layer substrate 16 that interface with electrical interconnects of a second surface mount connector on the uppermost layer of the multi-layer substrate 16 that interface with the integrated circuit 18 as will be described below. In other embodiments, the substrate 16 can be constructed of a non-organic ceramic- and or a hybrid organic ceramic-based substrate.

The electrical interconnects of the upper most layer of the multi-layer substrate 16 connect to the integrated circuit 18 through the solder bumps 20. After the integrated circuit 18 is seated on the multi-layer substrate 16, a reflow process is performed to enable the solder bumps 20 of the integrated circuit 18 to metallurgically link to the electrical interconnects of the multi-layer substrate 16. The solder bumps 20 are typically either lead free solder or copper (Cu) pillar and solder, although other material can be used for these joints such as gold (Au), indium (In), silver (Ag), anisotropic conductive adhesives, etc.

The underfill 22 is a material that is deposited between the integrated circuit 18 and the multi-layer substrate 16 to prevent damage to the solder bumps 20 due to mismatches in the coefficients of thermal expansion between the integrated circuit 18 and the multi-layer substrate 16 as well as acting as an adhesive to provide additional structural integrity to hold the integrated circuit 18 in place and prevent external load induced damage such as that that might occur when subjected to the heat sink 30 forces and/or shock and drop exposure.

The core of the multi-layer substrate 16 provides a certain stiffness to the multi-layer substrate 16. Even with that provided stiffness, multi-layer substrate 16 may warp due to mismatches in coefficients of thermal expansion for the integrated circuit 18, underfill 22, and multi-layer substrate 16. To reduce overall bow, the stiffener ring 24 is attached to the multi-layer substrate 16. The stiffener ring 24 may be connected to the upper layer of the multi-layer substrate 16 using adhesive materials such as epoxy.

Because air is a very poor thermal conductor, the thermal interface material 26 between the integrated circuit 18 and heat sink 30 may be required for thermal management of the integrated circuit 18.

The heat sink 30 may be connected to the PCB 12 via spring mounts 32 (only one of which is numbered) with the thermal interface material 26 in between a top of the integrated circuit 18 and a bottom of the heat sink 30. The spring mounts 32 are loaded such that the heat sink 30 is mechanically and thermally connected to the top of the integrated circuit 18 through the thermal interface material 26. In other embodiments, directional heat sinks such as graphite films could be used to dissipate the heat from the integrated circuit 18. In such an embodiment, springs mounts such as spring mounts 32 would not necessarily be required. The heat sink 30 may also be constructed using other heat sinking solutions well known in the art.

An external signal source 40 may be connected to the integrated circuit package 10 via a connector 42 which is connected to a blocking capacitor 44 on the PCB 12. The connector 42 can be a flex or cable connector. The blocking capacitor 44 may be connected to the integrated circuit package 10 via connection 46. While the connection 46 is shown as a single dashed line extending from the blocking capacitor 44 to the integrated circuit 18 for the purposes of illustration, a person of skill in the art will understand that the connection 46 is a series of electrical connections including a plurality of connections through the multi-layer substrate 16 such as pins or pads on the lowermost layer that interface with the printed circuit board 12 via the BGA 14, vias that connect the metallization structures that are interspersed in the core and build-up layers, and electrical interconnects within the first surface mount connector on an upper surface of the multi-layer substrate 16 that interface with the integrated circuit 18 through the solder bumps 20. All of these connections that make up the connection 46 present a chance for impedance losses or poor contact that slows or interrupts signal communication between the external signal source 40 and the integrated circuit 18.

Figure 2:
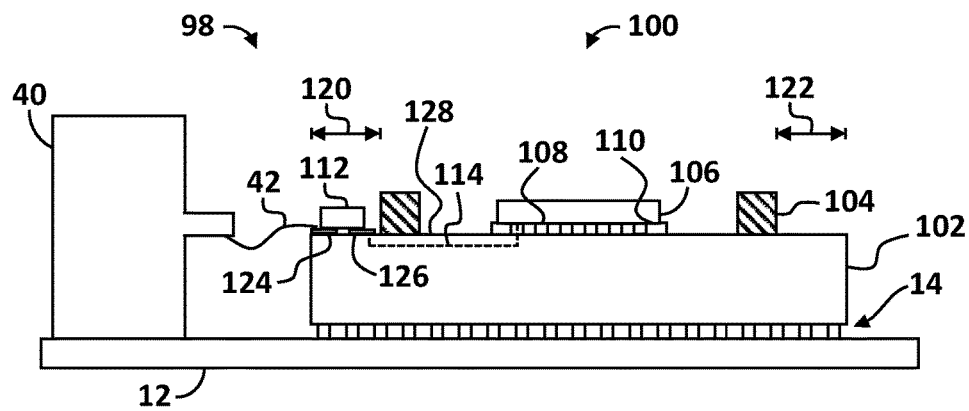
FIG. 2 is a partial sectional view of an integrated circuit package constructed in accordance with one embodiment of the presently disclosed inventive concepts.
Figure 3:
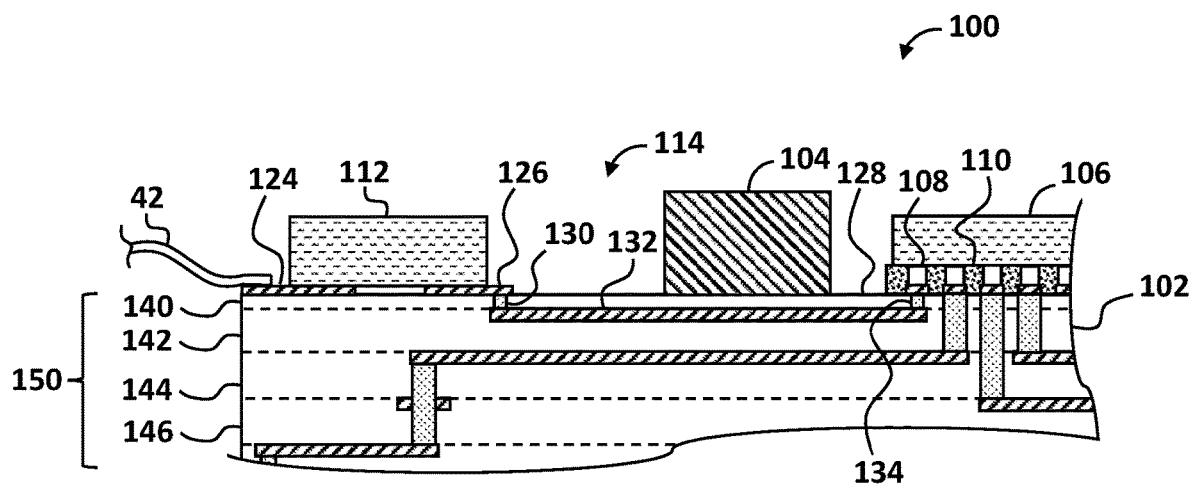
FIG. 3 is a sectional view of a portion of the integrated circuit package of FIG. 2.

Referring now to FIGS. 2 and 3, to overcome the problems and limitations with the prior art systems, an integrated circuit package 100 is provided having a multi-layer substrate 102 for receiving an integrated circuit 106. The integrated circuit package 100 also includes a stiffener ring 104, a first surface mount connector 108, e.g., solder bumps, underfill 110, a blocking capacitor 112, and at least one connection 114. The integrated circuit package 100 may be connected to the PCB 12 via a second surface mount connector, such as BGA 14. The integrated circuit package 100 may be connected to the external signal source 40 via the connector 42. In one embodiment, the integrated circuit package 100 may be connected to the PCB 12 and connected to the external signal source 40 via the connector 42 to form an assembly 98.

The integrated circuit 106 may be a digital signal processor, an application specific integrated circuit, a microprocessor, memory, a photonic integrated circuit, a computer processor, or a field programmable gate array.

The multi-layer substrate 102 may be provided with a first extension 120 and a second extension 122 both outside of a surface mount area configured to receive the integrated circuit 106. The first extension 120 provides a surface for placement and mounting of the connection 114, including the blocking capacitor 112 to the multi-layer substrate 102. The second extension 122 is substantially the same size as the first extension 120 and acts to balance the multi-layer substrate 102 to resist bowing and warping of the multi-layer substrate 102. While the multi-layer substrate 102 is illustrated as having the connection 114 and blocking capacitor 112 only on the first extension 120, it should be noted that in other embodiments, a second connection (not shown) and second blocking capacitor (not shown) could be placed and mounted on the second extension 122 to provide a second high band width interconnection between circuits on the second extension 122 side of the integrated circuit 106 and the rest of the system electronics, including but not limited to the integrated circuit 106.

To connect the blocking capacitor 112 to the multi-layer substrate 102, the multi-layer substrate 102 may include at least one first mounting pad 124 and at least one second mounting pad 126 on an upper surface 128 of the multi-layer substrate 102. The first and second mounting pads 124 and 126 may form part of the connection 114, and be positioned on the first extension 120. The connector 42 may be electrically connected to the first mounting pad 124 to connect the external signal source 40 to the blocking capacitor 112. The second mounting pad 126 may be electrically connected to additional conductive material in the form of lead(s), via(s), trace(s), surface mount pad(s), and combinations thereof to form the connection 114 to electrically connect the blocking capacitor 112 to the integrated circuit 106. The connection 114 can be configured in a variety of manners, such as differential pair routing in which two conductors are used to create a balanced transmission system able to carry differential (equal and opposite) signals from the connector 42 to the integrated circuit 106. In this example, the connection 114 would include at least two first mounting pads 124 connected to the connector 42.

In an exemplary embodiment illustrated in FIG. 3, the connection 114 may comprise a first electrical connection 130 electrically connected to the first mounting pad 124, a trace 132 extending underneath the stiffener ring 104, and a second electrical connection 134 electrically connected to the trace 132 and an electrical interconnect on the upper surface 128 of the multi-layer substrate 102 that interfaces with the integrated circuit 106 through the first surface mount connector 108, e.g., a solder bump. To facilitate the first and second electrical connections 130 and 134, microvias (also known in the art as Micro Via, Micro-Via, µVia or sometimes Laser Via, or Laser Ablated Via), for example, may be formed in a first dielectric layer 140 and metallized as is known in the art to form the first and second electrical connections 130 and 134.

The trace 132 may be a metalized structure constructed of electrically conductive material that is applied or embedded into a bottom side of the first dielectric layer 140 or a top side of a second dielectric layer 142 as is known in the art. A size and shape of the trace 132 may be optimized to reduce or prevent impedance losses.

Because the connection 114 is formed in the upper build-up layers 150 of the multi-layer substrate 102, and preferably in an upper half of the upper build-up layers 150, the connection 114 can be optimized for the best performance and the chances of bad connections are greatly reduced. More particularly, the first and second electrical connections 130 and 134 and the trace 132 may be optimized to reduce or eliminate impedance mismatches between the connection 114, the external signal source 40, and the integrated circuit 106.

Figure 5:
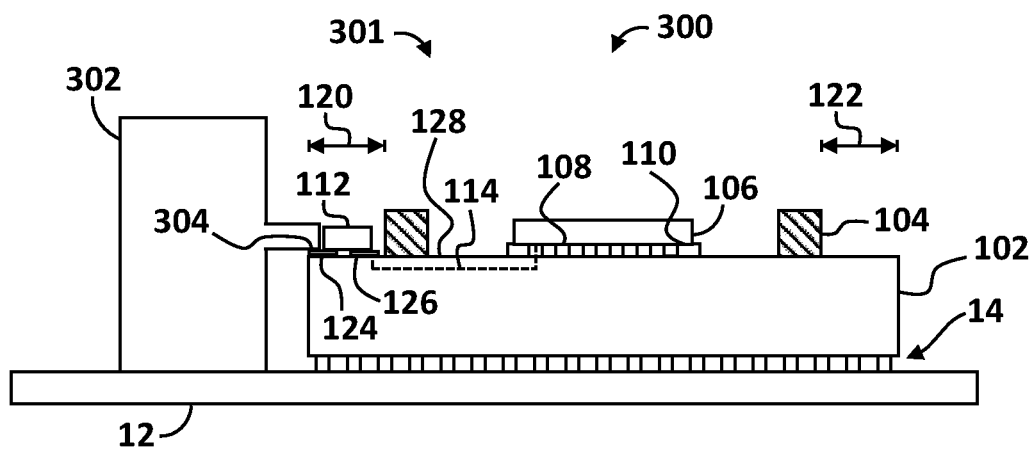
FIG. 5 is a partial sectional view of an integrated circuit package having a direct connection to an external signal source in accordance with one embodiment of the presently disclosed inventive concepts.

The connector 42 provides an external connection to the external signal source 40 and may be any one of connectors known in the art such as a flexible printed circuit (FPC), an RF interposer, a coaxial RF cable that is directly soldered, an RF connector, or directly soldering the external signal source 40 (as shown in FIG. 5), for instance. It should be noted, however, that these connectors are listed for the purposes of illustration only and should not be considered limiting. The connector 42 may be any type of connector now known or developed in the future that may be used to connect the external signal source 40 to the multi-layer substrate 102 of the integrated circuit package 100.

To make the integrated circuit package 100, the multi-layer substrate 102 is constructed in a manner known in the art having the at least one trace 132 positioned within the upper build-up layers 150. Then, the first electrical connection(s) 130 (one electrical connection 130 for each of the trace(s) 132), and the second electrical connection(s) 134 (one electrical connection 134 for each of the trace(s) 132) are formed. Once the first and second electrical connections 130 and 134 are formed, the at least one first mounting pad 124 and the at least one second mounting pad 126 can be formed on an upper surface of the multi-layer substrate 102, and the capacitor 112 can be attached to the at least one first mounting pad 124 and the at least one second mounting pad 126.

To use the integrated circuit package 100, the ball grid array 14 can be attached to a surface mount connector of the printed circuit board 12 to provide power, ground and a variety of electrical connections to the multi-layer substrate 102. Before or after the ball grid array 14 is attached to the surface mount connector of the printed circuit board 12, the integrated circuit 106 can be attached to the first surface mount connector 108 of the multi-layer substrate 102. To electrically connect the external signal source 40 to the integrated circuit 106 to established and/or permit high speed data communications therebetween, the connector 42 is attached to the at least one first mounting pad 124.

Figure 4A:
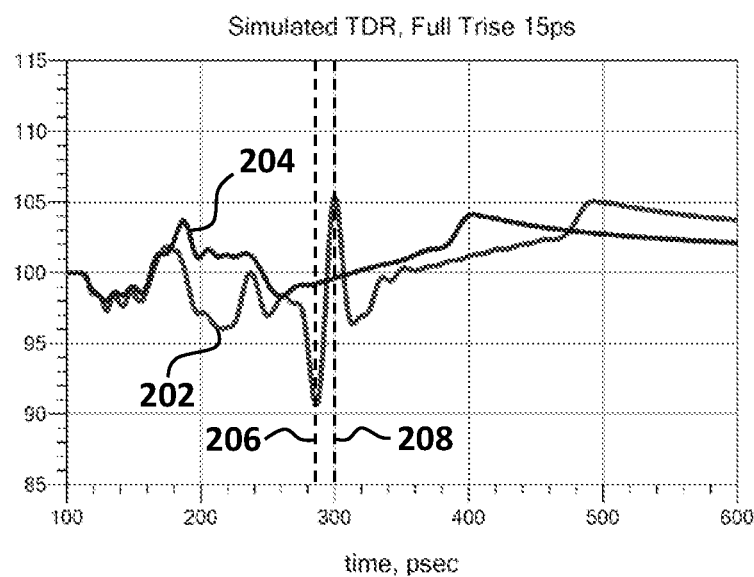
FIG. 4A is a graphical representation of a simulated Time Domain Reflectometry (TDR) analysis of the prior art integrated circuit package of FIG. 1 compared to a simulated TDR analysis of the integrated circuit package of FIG. 2.
Figure 4B:
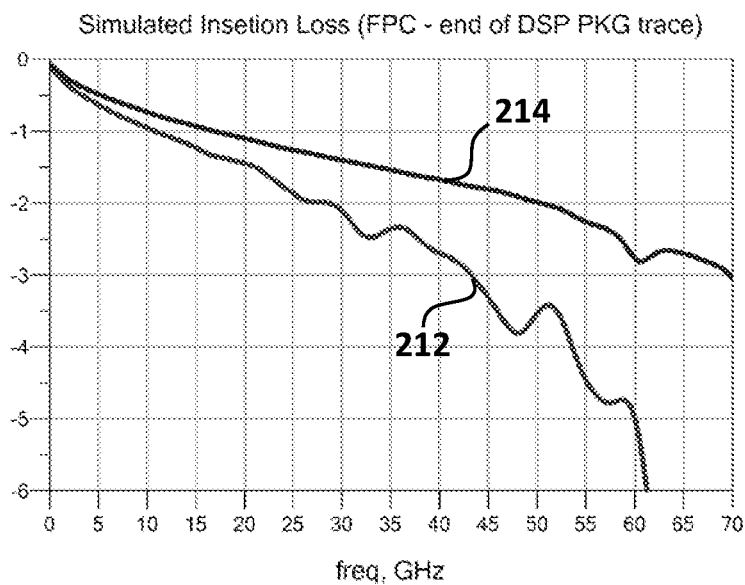
FIG. 4B is a graphical representation of a simulated insertion loss of the prior art integrated circuit package of FIG. 1 compared to a simulated insertion loss of the integrated circuit package of FIG. 2.
Figure 4C:
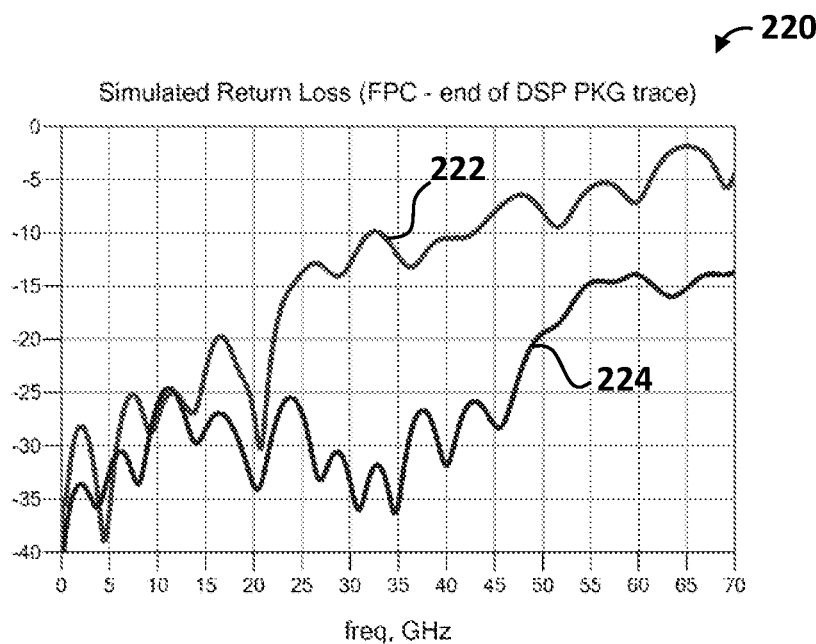
FIG. 4C is a graphical representation of a simulated return loss of the prior art integrated circuit package of FIG. 1 compared to a simulated return loss of the integrated circuit package of FIG. 2.

Referring now to FIGS. 4A-4C, shown therein are graphical representations 200, 210, and 220 illustrating a performance of the prior art integrated circuit package 10 compared to integrated circuit package 100.

Graphical representation 200 illustrates a simulated Time Domain Reflectometry (TDR) of pulsed signals travelling through the prior art integrated circuit package 10 and the integrated circuit package 100 compared to those produced by a standard impedance. The results of the signal travelling through the prior art integrated circuit package 10 are represented by line 202 and the results of the signal travelling through the integrated circuit package 100 are represented by line 204.

As can be seen in graphical representation 200, the signal travelling through the prior art integrated circuit package 10 experienced the most significant impedance changes at time 206 when the signal was passing through the BGA 14 and time 208 when the signal was passing through the various internal metallization structures and vias interspersed in the core and build-up layers of the multi-layer substrate 16. The BGA 14 connection and most of the metallization structures are bypassed in the integrated circuit package 100 which results in far fewer changes in impedance as the signal travels through the connection 114. This results in a much higher bandwidth in the integrated circuit package 100 when compared to the prior art integrated circuit package 10.

Graphical representation 210 illustrates a simulated insertion loss of the integrated circuit package 10 (represented by line 212) and the integrated circuit package 100 (represented by line 214). For the purposes of this disclosure, insertion loss is defined as a loss of signal power resulting from the insertion of the connector 42 to provide a bridging interconnect between the external signal source 40 and the prior art integrated circuit package 10 or the integrated circuit package 100. The loss of signal power is shown in decibels (dB) at a given frequency in GHz in graphical representation 210.

When insertion loss is compared between the prior art integrated circuit package 10 and the integrated circuit package 100, line 214 illustrates that there is a lower insertion loss and fewer ripples in the signal power of the integrated circuit package 100. In other words, the bandwidth of the integrated circuit package 100 is significantly decoupled from the BGA 14 and metallized structures in the multi-layer substrate 16 which results in a higher possible bandwidth in the integrated circuit package 100.

Graphical representation 220 illustrates a simulated return loss of the integrated circuit package 10 (represented by line 222) and the integrated circuit package 100 (represented by line 224). For the purposes of this disclosure, return loss is defined as a ratio in decibels of the power incident upon a discontinuity to the power reflected from the discontinuity. In other words, when the impedances of the external signal source 40, the connector 42, and a load (the second electrical connection 134) are identical, all of the incident power (except what is lost to attenuation in the transmission path), is completely absorbed by the load. When an impedance mismatch exists, some of the incident power is reflected by the impedance mismatch back toward the external signal source 40. The reflected wave interacts with the incident wave to produce what are called standing waves in the transmission path.

When return loss is compared between the integrated circuit package 10 and the integrated circuit package 100, line 224 illustrates that there is a higher return loss in the signal power of the integrated circuit package 100. In fact, there is a greater than 10 dB difference in reflection in the range of 0 GHz to 47 GHz. In other words, the higher return loss indicates that a possible bandwidth of the integrated circuit package 100 is higher than a possible bandwidth of the prior art integrated circuit package 10 because there is less impedance loss in the integrated circuit package 100.

Referring now to FIG. 5, shown therein is an integrated circuit package 300 that is similar in construction, making and use to integrated circuit package 100. Therefore, in the interest of brevity, only the differences between integrated circuit package 100 and integrated circuit package 300 will be numbered differently and discussed in detail herein.

In the embodiment illustrated in FIG. 5, an external signal source 302 is provided having a connector 304 that directly connects the external signal source 302 and the first mounting pad 124 on the upper surface 128 of the multi-layer substrate 102 of the integrated circuit package 300 when the integrated circuit package 300 and the external signal source 302 are installed on the PCB 12 to form an assembly 301.

Figure 6:
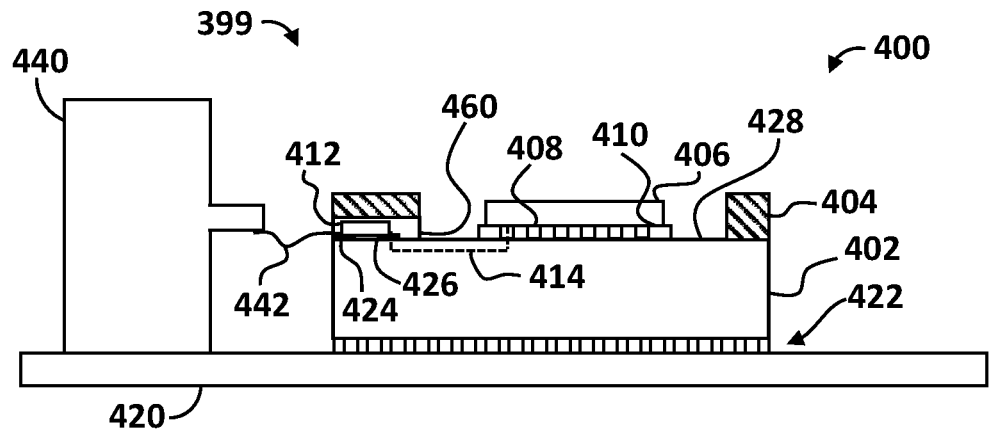
FIG. 6 is a partial sectional view of an integrated circuit package having a stiffener ring with a recess in accordance with one embodiment of the presently disclosed inventive concepts.
Figure 7:
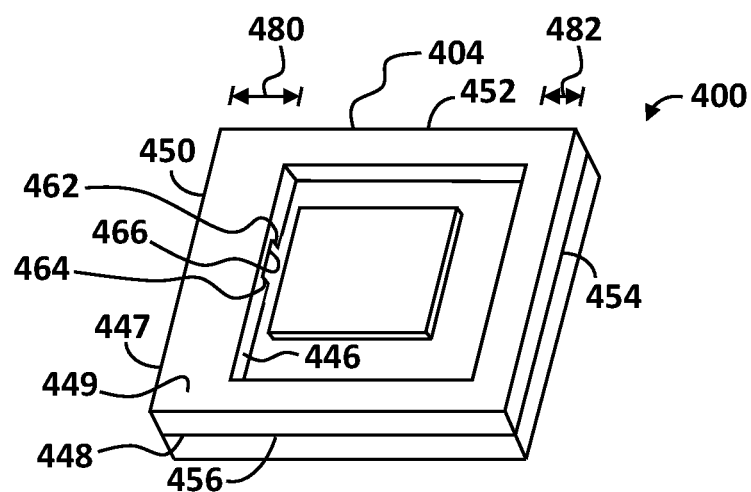
FIG. 7 is a perspective view of the integrated circuit package having a stiffener ring with a recess of FIG. 6 in accordance with one embodiment of the presently disclosed inventive concepts.

Referring now to FIGS. 6 and 7, shown therein is one embodiment of an integrated circuit package 400. The integrated circuit package 400 is similar in construction, making and use to integrated circuit package 100. Therefore, in the interest of brevity, only the differences will be discussed in detail herein.

In one exemplary embodiment, the integrated circuit package 400 may be provided with a multi-layer substrate 402 receiving an integrated circuit 406. The integrated circuit package 400 includes a stiffener ring 404, first surface mount connector 408, e.g., solder bumps, underfill 410, a blocking capacitor 412, and a connection 414. The integrated circuit package 400 may be connected to a PCB 420 via a second surface mount connector, e.g., BGA 422. The integrated circuit package 400 may be connected to the external signal source 440 via the connector 442. In one embodiment, the integrated circuit package 400 may be connected to the PCB 420 and the external signal source 440 via the connector 442 to form an assembly 399.

To connect the blocking capacitor 412 to the multi-layer substrate 402, a first mounting pad 424 and a second mounting pad 426 may be provided on an upper surface 428 of the multi-layer substrate 402. The connector 442 may be electrically connected to the first mounting pad 424 to connect the external signal source 440 to the blocking capacitor 412. The second mounting pad 426 may be electrically connected to the connection 414 to electrically connect the blocking capacitor 412 to the integrated circuit 406.

The stiffener ring 404 may be provided with an inner wall 446, an outer wall 447, a bottom surface 448, a top surface 449, a first side 450, a second side 452, a third side 454, and a fourth side 456. A recess 460 formed in the first side 450 of the stiffener ring 404 may be sized and shaped to allow the recess 460 to at least partially receive the blocking capacitor 412.

The recess 460 may be provided having a first sidewall 462, a second sidewall 464, and a top wall 466. The first sidewall 462 and the second sidewall 464 extend a predetermined distance from the bottom surface 448 of the first side 450 to the top wall 466 forming a substantially rectangular shape, for example. While the recess 460 is illustrated having a substantially rectangular shape, it should be noted that the recess 460 may be formed having different sizes and shapes so long as the recess allows the stiffener ring 404 to at least partially cover the blocking capacitor 412.

The first side 450 of the stiffener ring 404 may be provided having a width 480 extending from the inner wall 446 to the outer wall 447. The third side 454 of the stiffener ring 404 may be provided having a width 482 extending from the inner wall 446 to the outer wall 447. The width 480 of the first side 450 may be wider than the width 482 of the third side to add stiffness to the first side 450.

The blocking capacitor 412 may be provided having a width 484 and the integrated circuit 406 may be provided having a width 486.

In some embodiments of the stiffener ring 404, the width 480 of the first side 450 is between 1.25 and 2.5 times the width 482 of the third side 454. In some embodiments, the width 480 of the first side 450 of the stiffener ring 404 may be at least twenty percent (20%) larger than the width 484 of the blocking capacitor 412 and up to three quarters (¾) of the width 486 of the integrated circuit 406.

Figure 8:
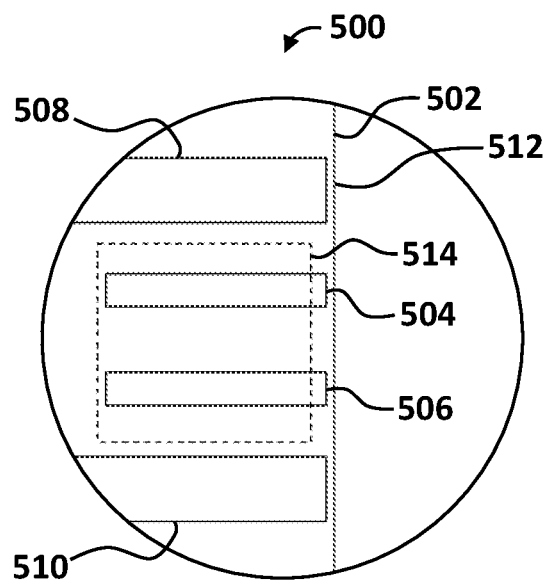
FIG. 8 is a detail view of a surface mount connector of an integrated circuit package in accordance with one embodiment of the presently disclosed inventive concepts.

Referring now to FIG. 8, a connection 500 is illustrated that may be used to connect an external signal source (not shown) such as external signal source 40 to a multi-layer substrate 502, such as the multi-layer substrate 102. The connection 500 may be provided having a first mounting pad 504, a second mounting pad 506, a first ground pad 508, and a second ground pad 510. The connection 500 may be installed on a first layer 512 of the multi-layer substrate 502. A second layer (not shown) of the multi-layer substrate 502 may be provided having an area 514 that is free from metallized structures.

In some embodiments, the first layer 512 of the multi-layer substrate 502 may be made of a dielectric material and the second layer of the multi-layer substrate 502 may be a ground plane and ground material may be removed from the area 514 in the ground plane to counteract capacitive impedance when a blocking capacitor such as blocking capacitor 112 is connected to the first mounting pad 504 and the second mounting pad 506 of the connection 500. A size and shape of the area 514 may be configured to optimize performance of the connection 500. The connection 500 may be used to connect: the connector 42 to the multi-layer substrate 102 of the integrated circuit package 100; the connector 304 to the multi-layer substrate 102 of the integrated circuit package 300; or the connector 442 to the multi-layer substrate 402 of the integrated circuit package 400.

Figure 9:
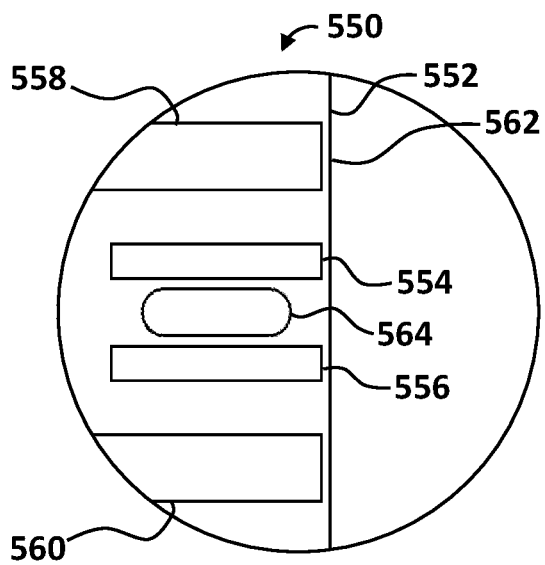
FIG. 9 is a detail view of another surface mount connector of an integrated circuit package in accordance with one embodiment of the presently disclosed inventive concepts.

Referring now to FIG. 9, a connection 550 is illustrated that may be used to connect an external signal source (not shown) such as external signal source 40 to a multi-layer substrate 552, such as the multi-layer substrate 102. The connection 550 may be provided having a first mounting pad 554, a second mounting pad 556, a first ground pad 558, and a second ground pad 560. The connection 550 may be installed on a first layer 562 of the multi-layer substrate 552.

In some embodiments, the first layer 562 of the multi-layer substrate 552 may be made of a dielectric material such as ceramic and a cutout 564 may be removed from the first layer 562 to counteract capacitive impedance when a blocking capacitor such as blocking capacitor 112 is connected to the first mounting pad 554 and the second mounting pad 556 of the connection 550. A size and shape of the cutout 564 may be configured to optimize performance of the connection 550. The connection 550 may be used to connect: the connector 42 to the multi-layer substrate 102 of the integrated circuit package 100; the connector 304 to the multi-layer substrate 102 of the integrated circuit package 300; or the connector 442 to the multi-layer substrate 402 of the integrated circuit package 400.

Figures 10, 11:
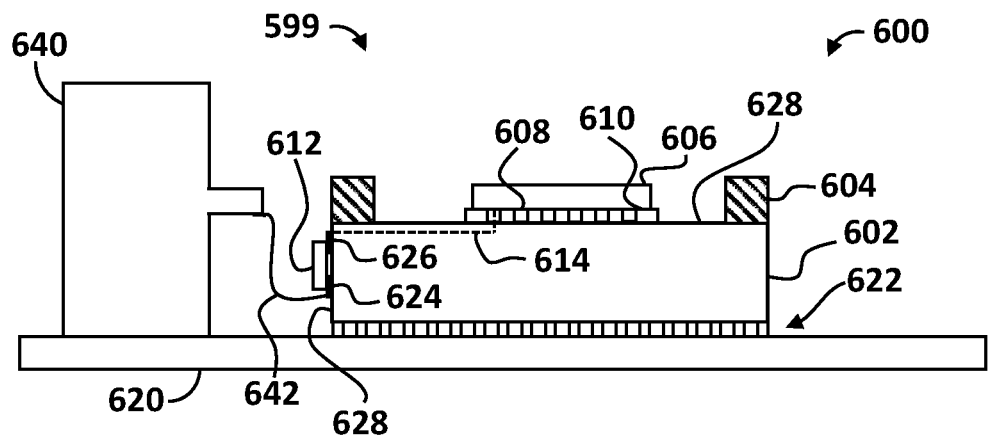
FIG. 10 is a partial sectional view of an integrated circuit package having a blocking capacitor connected to a side of a multi-layer substrate in accordance with one embodiment of the presently disclosed inventive concepts.
FIG. 11 is a partial sectional view of an integrated circuit package having a blocking capacitor embedded in a multi-layer substrate in accordance with one embodiment of the presently disclosed inventive concepts.

Referring now to FIG. 10, shown therein is one embodiment of an integrated circuit package 600. The integrated circuit package 600 is similar in construction, making and use to integrated circuit package 100. Therefore, in the interest of brevity, only the differences will be discussed in detail herein.

In one exemplary embodiment, the integrated circuit package 600 may be provided with a multi-layer substrate 602 receiving an integrated circuit 606. The integrated circuit package 600 may also include a stiffener ring 604, solder bumps 608, underfill 610, a blocking capacitor 612, and a connection 614. The integrated circuit package 600 may be connected to a PCB 620 via BGA 622. The integrated circuit package 600 may be connected to an external signal source 640 via a connector 642, which may be configured as the connection 500 or the connection 550. In one embodiment, the integrated circuit package 600 may be connected to the PCB 620 and the external signal source 640 via the connector 642 to form an assembly 599.

To connect the blocking capacitor 612 to the multi-layer substrate 602, a first mounting pad 624 and a second mounting pad 626 may be provided on a side surface 628 of the multi-layer substrate 602. The connector 642 may be electrically connected to the first mounting pad 624 to connect the external signal source 640 to the blocking capacitor 612. The second mounting pad 626 may be electrically connected to the connection 614 to electrically connect the blocking capacitor 612 to the integrated circuit 606.

Referring now to FIG. 11, shown therein is one embodiment of an integrated circuit package 700. The integrated circuit package 700 is similar in construction, making and use to integrated circuit package 100. Therefore, in the interest of brevity, only the differences will be discussed in detail herein.

In one exemplary embodiment, the integrated circuit package 700 may be provided with a multi-layer substrate 702 receiving an integrated circuit 706. The integrated circuit package 700 may also include a stiffener ring 704, solder bumps 708, underfill 710, a blocking capacitor 712, and a connection 714. The integrated circuit package 700 may be connected to a PCB 720 via BGA 722. The integrated circuit package 700 may be connected to an external signal source 740 via a connector 742. In one embodiment, the integrated circuit package 700 may be connected to the PCB 720 and the external signal source 740 via the connector 742 to form an assembly 699.

The blocking capacitor 712 may be embedded in the multi-layer substrate 702 and connected to a first mounting pad 724 and a second mounting pad 726. The connector 742 may be electrically connected to the first mounting pad 724 to connect the external signal source 740 to the blocking capacitor 712. The second mounting pad 726 may be electrically connected to the connection 714 to electrically connect the blocking capacitor 712 to the integrated circuit 606.

While the blocking capacitor 712 is shown embedded in the multi-layer substrate 702 near an outer edge, it should be noted that in other embodiments of the integrated circuit package 700, the blocking capacitor 712 may be positioned anywhere in the multi-layer substrate 702 along the connection 714 so long as an electrical connection (not shown) is provided between the connector 742 and the first mounting pad 724

Figure 12:
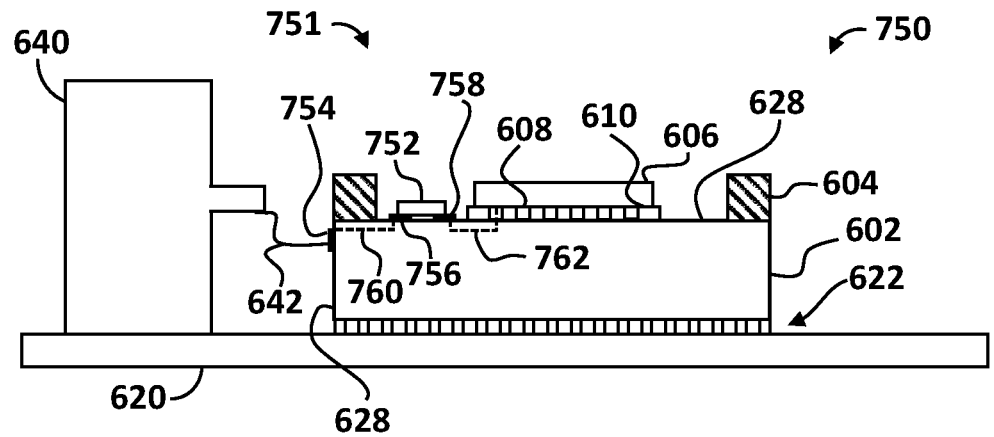
FIG. 12 is a partial sectional view of an integrated circuit package having a blocking capacitor positioned between a stiffener ring and an integrated circuit in accordance with one embodiment of the presently disclosed inventive concepts.

Referring now to FIG. 12, shown therein is one embodiment of an integrated circuit package 750. The integrated circuit package 750 is similar to integrated circuit package 600. Therefore, in the interest of brevity, only the differences will be discussed in detail herein.

In one exemplary embodiment, the integrated circuit package 750 may be provided with a blocking capacitor 752, a connection pad 754, a first mounting pad 756, a second mounting pad 758, a first connection 760, and a second connection 762.

The connection pad 754 is electrically connected to the connector 642 to provide an electrical path for signals from the external signal source 640 to the integrated circuit package 750 to form an assembly 751.

The first connection 760 electrically connects the connection pad 754 to the first mounting pad 756, and the second connection 762 electrically connects the second mounting pad 758 to the integrated circuit 606. As illustrated in FIG. 12, the blocking capacitor 752 may be installed on the surface 628 of the substrate between the stiffener ring 604 and the integrated circuit 606.

Figure 13:
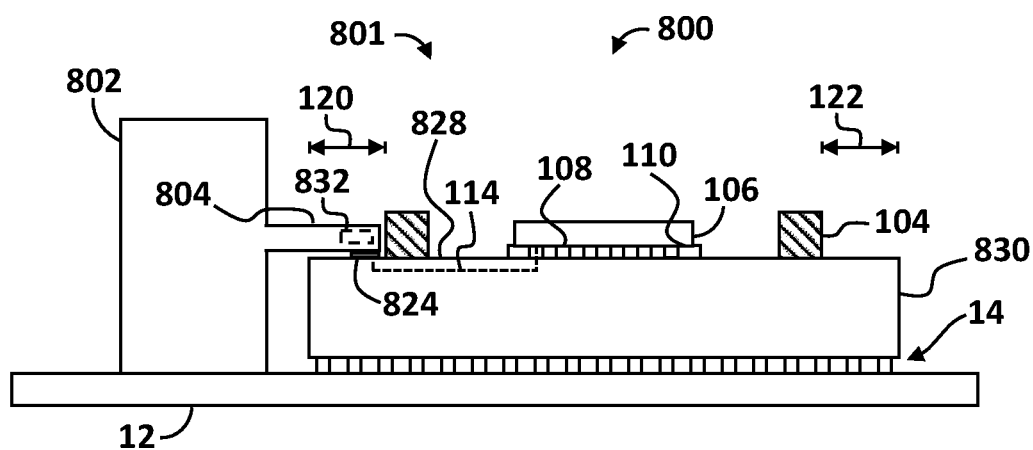
FIG. 13 is a partial sectional view of an integrated circuit package having a blocking capacitor embedded in a connector that connects an external signal source to a multi-layer substrate in accordance with one embodiment of the presently disclosed inventive concepts.

Referring now to FIG. 13, shown therein is an integrated circuit package 800 that is similar to integrated circuit package 300. Therefore, in the interest of brevity, only the differences between integrated circuit package 300 and integrated circuit package 800 will be numbered differently and discussed in detail herein.

In the embodiment illustrated in FIG. 13, an external signal source 802 is provided having a first connector 804 that directly connects the external signal source 802 and a second connector 824 on a surface 828 of a multi-layer substrate 830 of the integrated circuit package 800 when the integrated circuit package 800 and the external signal source 802 are installed on the PCB 12 to form an assembly 801.

The first connector 804 may be provided with a blocking capacitor 832 that is electrically connected to the second connector 824. While the blocking capacitor 832 is shown built-in to the first connector 804 in FIG. 13, it should be noted that in other embodiments, the blocking capacitor 832 may be installed on a surface of the first connector 804 and electrically connected to the second connector 824.

CONCLUSION

Conventionally, a connection between an external signal source and an integrated circuit supported by an integrated circuit package has been susceptible to signal degradation and/or signal loss due to low bandwidth connections, impedance losses, and bad connections because the connection is made up of a series of connections including a plurality of connections through the multi-layer substrate such as pins or pads on the lowermost layer that interface with a BGA, vias that connect metallization structures that are interspersed in the core and build-up layers, and electrical interconnects on an upper surface of the multi-layer substrate that interface with the integrated circuit through solder bumps. All of these connections that make up the connection present a chance for there to be impedance losses or a bad connection that slows or interrupts signal communication between the external signal source and the integrated circuit. In accordance with the present disclosure, a connection that is formed only in the upper build-up layers of a multi-layer substrate is provided that can be optimized to reduce or eliminate impedance mismatches between the connection, the external signal source, and the integrated circuit and greatly reduce the chances of a bad connection.

The foregoing description provides illustration and description, but is not intended to be exhaustive or to limit the inventive concepts to the precise form disclosed. Modifications and variations are possible in light of the above teachings or may be acquired from practice of the methodologies set forth in the present disclosure.

Even though particular combinations of features are recited in the claims and/or disclosed in the specification, these combinations are not intended to limit the disclosure. In fact, many of these features may be combined in ways not specifically recited in the claims and/or disclosed in the specification. Although each dependent claim listed below may directly depend on only one other claim, the disclosure includes each dependent claim in combination with every other claim in the claim set.

No element, act, or instruction used in the present application should be construed as critical or essential to the invention unless explicitly described as such outside of the preferred embodiment. Further, the phrase "based on" is intended to mean "based, at least in part, on" unless explicitly stated otherwise.

REFERENCES

The following references are hereby incorporated herein by reference:
1. BGA package technology considerations for high speed and RF applications, January 2013, Conference: Microelectronics Packaging Conference (EMPC), 2013 European, Laurent Marechal, David Auchere, Yvon Imbs.
2. High-speed differential interconnection design for flip-chip BGA packages IEEE 8th Electronics Packaging conference, 2006, W. L. Yuan; H. P. Kuah; C. K. Wang; Anthony Y. S. Sun; W. H. Zhu; H. B. Tan; A. D. Muhamad.

What is claimed is:
1. An integrated circuit package, comprising:
a multi-layer substrate having a plurality of lower layers, at least one core layer, a plurality of upper layers, and a side surface, a first connection that extends through or on an uppermost layer of the upper layers, a second connection that extends through or on the uppermost layer of the upper layers, and a trace embedded in or on one of the plurality of upper layers, the trace electrically connected to the first and second connections;
an integrated circuit positioned on an uppermost layer of the plurality of upper layers of the multi-layer substrate and connected to the multi-layer substrate, the integrated circuit electrically connected to the second connection;
a first mounting pad and a second mounting pad positioned on at least one of an outer peripheral edge and the uppermost layer of the plurality of upper layers of the multi-layer substrate, the second mounting pad electrically connected to the first connection;
a blocking capacitor electrically connected to the first mounting pad and the second mounting pad;
a stiffener ring having an inner wall, an outer wall, a bottom surface, and a top surface, the bottom surface positioned on and connected to the uppermost layer of the multi-layer substrate surrounding the integrated circuit;
wherein the stiffener ring is provided with a recess formed in a first side of the stiffener ring, the recess sized and shaped to at least partially receive the blocking capacitor when the stiffener ring is connected to the uppermost layer of the multi-layer substrate.

2. The integrated circuit package of claim 1, wherein the multi-layer substrate further comprises a first extension and a second extension, the first extension and the second extension extending a predetermined distance from the outer wall of the stiffener ring, the first and second extension formed on opposite sides of the multi-layer substrate, the first mounting pad, the second mounting pad, and the blocking capacitor being positioned on the first extension of the multi-layer substrate.

3. The integrated circuit package of claim 1, wherein the stiffener ring further has a second side opposite the first side, the first side having a width that is between one and a half times and two times as wide as a width of the second side of the stiffener ring.

4. The integrated circuit package of claim 1, wherein the recess forms a substantially rectangular shape.

5. The integrated circuit package of claim 1, further comprising an external connector, the external connector having a first end electrically connected to the first mounting pad and a second end configured to be electrically connected to an external signal source.

6. The integrated circuit package of claim 1, wherein the first mounting pad is configured to be directly connected to an external signal source.

7. The integrated circuit package of claim 1, wherein the first and second connections are microvias.

8. The integrated circuit package of claim 1, wherein a size of the first connection, the second connection, and the trace are optimized to reduce impedance losses between the blocking capacitor and the integrated circuit.

9. The integrated circuit package of claim 1, wherein the uppermost layer of the plurality of upper layers is a first layer and the plurality of upper layers further comprises a second layer and a third layer and the trace is embedded in at least one of the second layer and the third layer.

10. A multi-layer substrate, comprising:
a plurality of lower layers, at least one core layer, a plurality of upper layers, a side surface, a first connection that extends through or on an uppermost layer of the plurality of upper layers, a second connection that extends through or on the uppermost layer of the upper layers, and a trace embedded in or on one of the plurality of upper layers, the trace electrically connected to the first connection and the second connection;
a first mounting pad and a second mounting pad positioned on at least one of the side surface and the uppermost layer of the plurality of upper layers, the second mounting pad electrically connected to the first connection;

a blocking capacitor electrically connected to the first mounting pad and the second mounting pad;

a stiffener ring having an inner wall, an outer wall, a bottom surface, and a top surface, the bottom surface positioned on and connected to the uppermost layer of the multi-layer substrate;

wherein the stiffener ring is provided with a recess formed in a first side of the stiffener ring, the recess sized and shaped to at least partially receive the blocking capacitor when the stiffener ring is connected to the uppermost layer of the multi-layer substrate.

11. The multi-layer substrate of claim 10, wherein the first mounting pad is configured to be directly connected to an external signal source.

12. The multi-layer substrate of claim 10, wherein the first connection and the second connection in the multi-layer substrate are microvias.

13. The multi-layer substrate of claim 10, further comprising an integrated circuit positioned on the uppermost layer of the plurality of upper layers of the multi-layer substrate and connected to the multi-layer substrate, the integrated circuit electrically connected to the second connection.

14. The multi-layer substrate of claim 13, wherein a size of the first connection, the second connection, and the trace are optimized to reduce impedance losses between the blocking capacitor and the integrated circuit.

15. The multi-layer substrate of claim 10, further comprising an external connector, the external connector having a first end electrically connected to the first mounting pad and a second end configured to be electrically connected to an external signal source.

16. The multi-layer substrate of claim 10, wherein the stiffener ring further has a second side opposite the first side, the first side having a width that is between one and a half times and two times as wide as a width of the second side of the stiffener ring.

17. An assembly, comprising:
a multi-layer substrate comprising:
 a plurality of lower layers, at least one core layer, a plurality of upper layers, and a side surface, a first connection that extends through or on an uppermost layer of the upper layers, a second connection that extends through or on the uppermost layer of the upper layers, and a trace embedded in or on one of the plurality of upper layers, the trace electrically connected to the first and second connections;
 a first mounting pad and a second mounting pad positioned on at least one of an outer peripheral edge and the uppermost layer of the plurality of upper layers of the multi-layer substrate, the second mounting pad electrically connected to the first connection; and
 a blocking capacitor electrically connected to the first mounting pad and the second mounting pad;
 a stiffener ring having an inner wall, an outer wall, a bottom surface, and a top surface, the bottom surface positioned on and connected to the uppermost layer of the multi-layer substrate, the stiffener ring being provided with a recess formed in a first side of the stiffener ring, the recess sized and shaped to at least partially receive the blocking capacitor when the stiffener ring is connected to the uppermost layer of the multi-layer substrate;
an integrated circuit positioned on the uppermost layer of the plurality of upper layers of the multi-layer substrate and connected to the multi-layer substrate, the integrated circuit electrically connected to the second connection;
an external signal source electrically connected to the first mounting pad of the multi-layer substrate via a connector; and
a printed circuit board, the multi-layer substrate and external signal source connected to the printed circuit board.

* * * * *